United States Patent
Kondo et al.

(10) Patent No.: US 9,787,062 B2
(45) Date of Patent: Oct. 10, 2017

(54) VERTICAL CAVITY SURFACE EMITTING LASER ARRAY AND METHOD FOR MANUFACTURING VERTICAL CAVITY SURFACE EMITTING LASER ARRAY

(71) Applicant: FUJI XEROX CO., LTD., Tokyo (JP)

(72) Inventors: Takashi Kondo, Kanagawa (JP);
Akemi Murakami, Kanagawa (JP);
Naoki Jogan, Kanagawa (JP);
Junichiro Hayakawa, Kanagawa (JP);
Jun Sakurai, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/209,973

(22) Filed: Jul. 14, 2016

(65) Prior Publication Data

US 2017/0070027 A1 Mar. 9, 2017

(30) Foreign Application Priority Data

Sep. 3, 2015 (JP) .................................. 2015-173992

(51) Int. Cl.
| | |
|---|---|
| *H01S 5/00* | (2006.01) |
| *H01S 5/42* | (2006.01) |
| *H01S 5/042* | (2006.01) |
| *H01S 5/022* | (2006.01) |
| *H01S 5/183* | (2006.01) |
| *H01S 5/343* | (2006.01) |

(52) U.S. Cl.
CPC ............ *H01S 5/423* (2013.01); *H01S 5/0425* (2013.01); *H01S 5/02276* (2013.01); *H01S 5/18313* (2013.01); *H01S 5/3432* (2013.01)

(58) Field of Classification Search
None
See application file for complete search history.

(56) References Cited

U.S. PATENT DOCUMENTS

2011/0079798 A1 4/2011 Ogihara

FOREIGN PATENT DOCUMENTS

| JP | 2009-238963 A | 10/2009 |
|---|---|---|
| JP | 2011-77447 A | 4/2011 |
| JP | 2012-28749 A | 2/2012 |

(Continued)

OTHER PUBLICATIONS

Communication dated Nov. 8, 2016 from the Japanese Patent Office in counterpart Application No. 2015-173992.

(Continued)

*Primary Examiner* — Armando Rodriguez
(74) *Attorney, Agent, or Firm* — Sughrue Mion, PLLC

(57) ABSTRACT

A vertical cavity surface emitting laser array includes a contact layer formed on a substrate; mesa structures formed on the contact layer, each mesa structure including a first semiconductor multilayer reflector of a first conductivity type, an active region on the first semiconductor multilayer reflector, and a second semiconductor multilayer reflector of a second conductivity type on the active region; a first metal layer formed on the contact layer around the mesa structures, a portion of the first metal layer serving as an electrode pad of the first conductivity type; an insulating film formed on the first metal layer; and a second metal layer formed on the insulating film, a portion of the second metal layer serving as an electrode pad of the second conductivity type. The mesa structures are electrically connected in parallel.

13 Claims, 7 Drawing Sheets

(56) References Cited

FOREIGN PATENT DOCUMENTS

| JP | 2013-65692 A | 4/2013 |
|---|---|---|
| JP | 2014-150225 A | 8/2014 |
| WO | 2010/084890 A1 | 7/2010 |

OTHER PUBLICATIONS

Communication dated Feb. 7, 2017, from the Japanese Patent Office in counterpart Japanese application No. 2015-173992.

US 9,787,062 B2

VERTICAL CAVITY SURFACE EMITTING LASER ARRAY AND METHOD FOR MANUFACTURING VERTICAL CAVITY SURFACE EMITTING LASER ARRAY

CROSS-REFERENCE TO RELATED APPLICATIONS

This application is based on and claims priority under 35 USC 119 from Japanese Patent Application No. 2015-173992 filed Sep. 3, 2015.

BACKGROUND

Technical Field

The present invention relates to a vertical cavity surface emitting laser array and a method for manufacturing a vertical cavity surface emitting laser array.

SUMMARY

According to an aspect of the invention, there is provided a vertical cavity surface emitting laser array including a contact layer formed on a substrate; mesa structures formed on the contact layer, each mesa structure including a first semiconductor multilayer reflector of a first conductivity type, an active region on the first semiconductor multilayer reflector, and a second semiconductor multilayer reflector of a second conductivity type on the active region; a first metal layer formed on the contact layer around the mesa structures, a portion of the first metal layer serving as an electrode pad of the first conductivity type; an insulating film formed on the first metal layer; and a second metal layer formed on the insulating film, a portion of the second metal layer serving as an electrode pad of the second conductivity type. The mesa structures are electrically connected in parallel.

BRIEF DESCRIPTION OF THE DRAWINGS

Exemplary embodiments of the present invention will be described in detail based on the following figures, wherein.

DETAILED DESCRIPTION

Exemplary Embodiments of the present invention will now be described in detail with reference to the drawings.

First Exemplary Embodiment

A vertical cavity surface emitting laser (VCSEL) array 10 according to a first exemplary embodiment will be described with reference to FIGS. 1A to 5D.

Figure 1A:
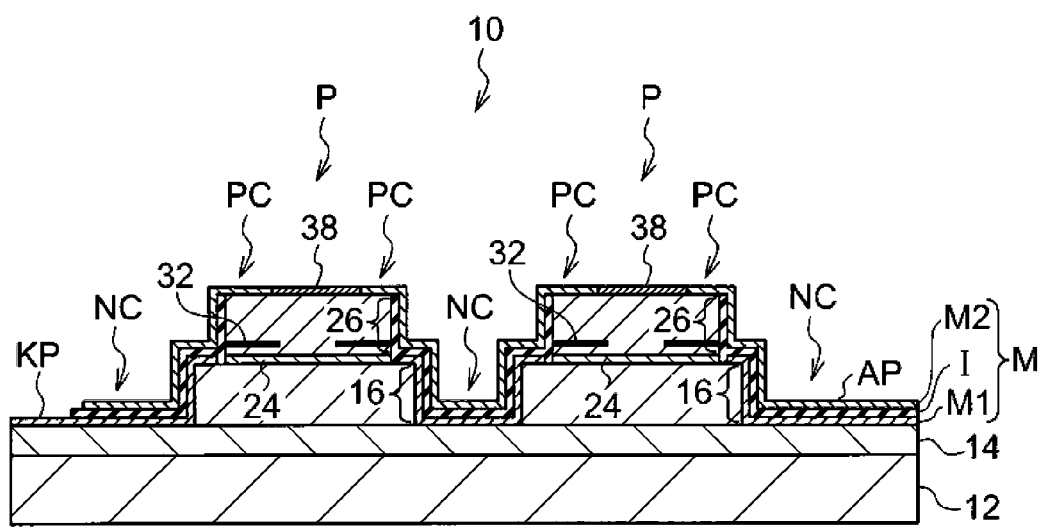
FIGS. 1A and 1B are vertical sectional views illustrating an example of the structure of a vertical cavity surface emitting laser array according to a first exemplary embodiment.
Figure 1B:
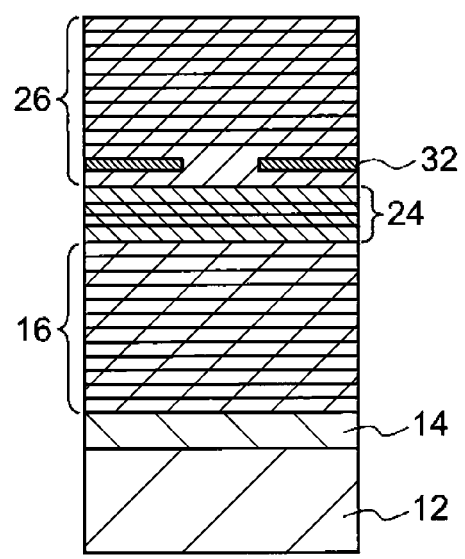

FIG. 1A is a vertical sectional view illustrating an example of the structure of the VCSEL array 10 according to the first exemplary embodiment. FIG. 1B is a detailed view of a portion of the structure illustrated in FIG. 1A. In the first exemplary embodiment, a GaAs vertical cavity surface emitting laser array including a GaAs substrate will be described. However, the vertical cavity surface emitting laser array is not limited to this, and may instead include an InGaAsP-based, AlGaInP-based, or InGaN/GaN-based material. Although an n-type buffer layer is used in the first exemplary embodiment, a p-type buffer layer may instead be used. In such a case, "n-type" in the following description may be read as "p-type".

As illustrated in FIG. 1A, the VCSEL array 10 includes a substrate 12, a buffer layer 14, lower distributed Bragg reflectors (DBRs) 16, resonators 24, current constriction layers 32, upper DBRs 26, emission protection films 38, and a multilayer metal film M. The lower DBRs 16, the resonators 24, the current constriction layers 32, and the upper DBRs 26 provided on the buffer layer 14 have a mesa shape and form posts P that serve as light emitting portions. The VCSEL array 10 includes the posts P. In other words, the VCSEL array 10 is a single semiconductor chip including plural posts P.

The substrate 12 according to the first exemplary embodiment is, for example, a semi-insulating GaAs substrate. The semi-insulating GaAs substrate is a GaAs substrate that is not doped with impurities and that has a very high resistance. The sheet resistance value of the semi-insulating GaAs substrate is about several megaohms. A conductive substrate or an insulating substrate may be used instead of the semi-insulating substrate. In such a case, for example, the VCSEL array 10 may be formed on a GaAs substrate, separated from the GaAs substrate, and then attached to a substrate having a high thermal conductivity, such as an insulating AlN substrate or a conductive Cu substrate.

The buffer layer 14 formed on the substrate 12 is composed of, for example, a silicon (Si) doped GaAs layer and supplies a negative potential to the light emitting portions (posts P). More specifically, a first metal layer M1 is formed on the buffer layer 14 in partial regions thereof, and the n-type lower DBRs 16 are also formed on the buffer layer 14. When a cathode electrode pad KP, which is a portion of the first metal layer M1, is connected to a negative terminal of a power supply, the negative potential is supplied to the light emitting portions through the buffer layer 14. The buffer layer 14 according to the first exemplary embodiment also has a function of improving the crystallinity of the front surface of the substrate after thermal cleaning. However, the buffer layer 14 is not limited to this, and this function may be provided by another layer.

The n-type lower DBRs 16 formed on the buffer layer 14 are multilayer reflectors obtained by alternately stacking two types of semiconductor layers (for example, AlGaAs layers) having different refractive indices and each having a thickness of $0.25\lambda'/n$, where $\lambda'$ is the oscillation wavelength of the VCSEL array 10 and n is the refractive index of the medium (semiconductor layers). In the VCSEL array 10 according to the first exemplary embodiment, the oscillation wavelength $\lambda'$ is, for example, 780 nm. In the following description, $\lambda$ ($=\lambda'/n$) is referred to as the wavelength in the medium.

Each of the resonators 24 formed on the lower DBRs 16 is obtained by successively stacking a lower spacer layer, an active layer (quantum well active layer), and an upper spacer layer (not shown) on the substrate 12 in that order. Each resonator 24 has one reflecting surface at the interface between the corresponding lower DBR 16 and the lower spacer layer, and the other reflecting surface at the interface between the corresponding upper DBR 26 and the upper spacer layer. The lower spacer layer and the upper spacer layer are respectively disposed between the quantum well active layer and the lower DBR 16 and between the quantum well active layer and the upper DBR 26, thereby providing a function of adjusting the length of the resonator 24 and a function of a cladding layer for confining carriers.

The current constriction layers 32 provided on the resonators 24 include current injection regions and selective oxidation regions (not shown). The selective oxidation regions are regions at the peripheries of the posts P that have been oxidized in an oxidation step of a VCSEL array manufacturing method, and the current injection regions are regions that have not been oxidized. The current injection regions have a circular or approximately circular shape. The current injection regions regulate the current that flows through the light emitting portions of the VCSEL array 10, and control, for example, the transverse mode of the oscillation in the light emitting portions.

The upper DBRs 26 formed on the current constriction layers 32 are multilayer reflectors obtained by alternately stacking two types of semiconductor layers (for example, AlGaAs layers) having different refractive indices and each having a thickness of $0.25\lambda$. Although not illustrated, p-type contact layers are provided on the top surfaces of the upper DBRs 26.

The multilayer metal film M includes the first metal layer M1, an interlayer insulating film I, and a second metal layer M2 that are stacked on the substrate 12 in that order. The first metal layer M1 constitutes a wiring layer for the cathode of the VCSEL array 10, and the second metal layer M2 constitutes a wiring layer for the anode of the VCSEL array 10.

More specifically, as illustrated in FIG. 1A, the first metal layer M1 is formed on a front surface of the buffer layer 14, side surfaces of the lower DBRs 16, and portions of front surfaces of the lower DBRs 16, and a portion thereof serves as the cathode electrode pad KP. The cathode electrode pad KP is connected to the negative terminal of the power supply, so that a negative potential is applied to the light emitting portions. The first metal layer M1 is in ohmic contact with the buffer layer 14 in n-side contact regions NC illustrated in FIG. 1A, which are contact regions between the first metal layer M1 and the buffer layer 14.

The interlayer insulating film I is provided so as to surround the semiconductor layers including the posts P and serves as a protecting film having a function of, for example, preventing the semiconductor layers from being exposed to external moisture or the like. The interlayer insulating film I is formed of, for example, a silicon oxynitride (SiON) film or a silicon nitride (SiN) film. The interlayer insulating film I according to the first exemplary embodiment is disposed between the first metal layer M1 and the second metal layer M2 so as to electrically separate the first metal layer M1 and the second metal layer M2 from each other.

As illustrated in FIG. 1A, the second metal layer M2 is formed on the interlayer insulating film I along the buffer layer 14, side surfaces of the lower DBRs 16, side surfaces of the upper DBRs 26, and portions of top surfaces of the upper DBRs 26, and a portion thereof serves as an anode electrode pad AP. The anode electrode pad AP is connected to the positive terminal of the power supply, so that a positive potential is applied to the light emitting portions. The second metal layer M2 is in ohmic contact with p-type contact layers (not shown) provided on the upper DBRs 26 in p-side contact regions PC illustrated in FIG. 1A.

Figure 2A:
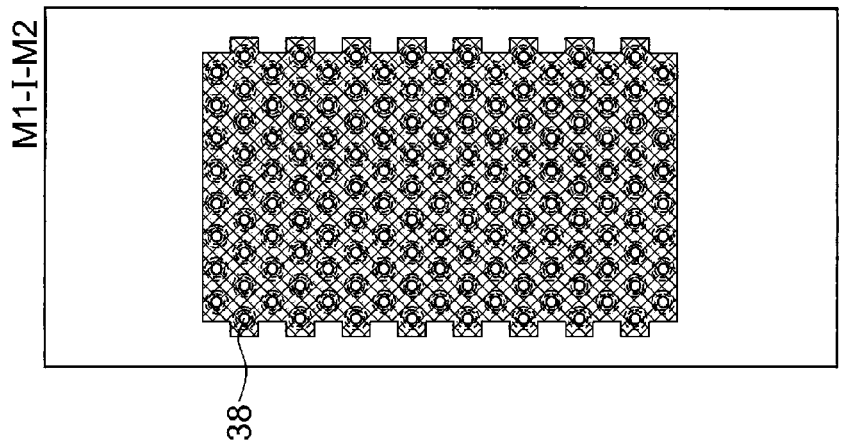
FIGS. 2A to 2C are plan views illustrating a multilayer metal film included in the vertical cavity surface emitting laser array according to the first exemplary embodiment.
Figure 2B:
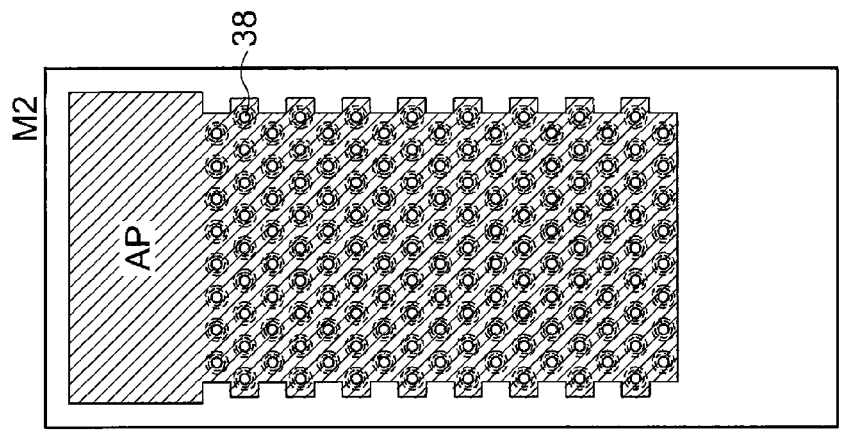
Figure 2C:
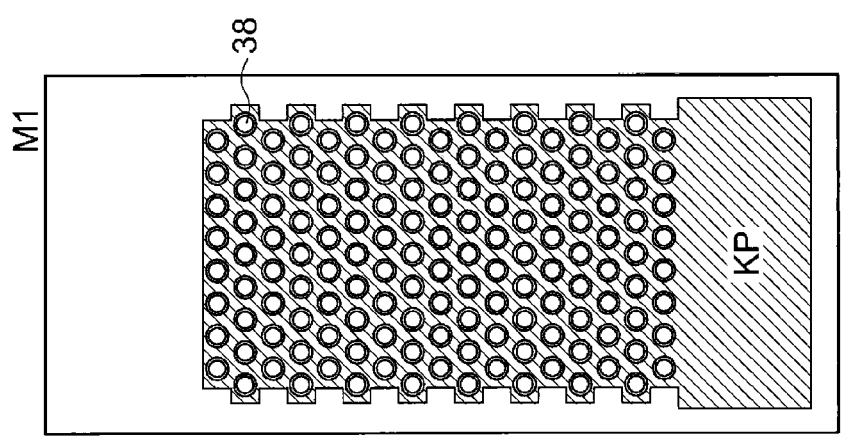

FIGS. 2A to 2C are plan views of the multilayer metal film M. FIG. 2A illustrates the first metal layer M1, that is, a wiring layer for the cathode, and FIG. 2B illustrates the second metal layer M2, that is, a wiring layer for the anode. As illustrated in FIGS. 2A and 2B, each of the first metal layer M1 and the second metal layer M2 is a single continuous metal layer that extends over an area including all of the posts P and that surrounds each of the posts P. FIG. 2C illustrates the region in which the first metal layer M1, the interlayer insulating film I, and the second metal layer M2 overlap in plan view of the VCSEL array 10, that is, the region in which the first metal layer M1, the interlayer insulating film I, and the second metal layer M2 are formed on the substrate 12 in that order. This region is hereinafter sometimes referred to as an "M1-I-M2 region". The first metal layer M1 and the second metal layer M2 have substantially the same size in plan view in the region in which the posts P are formed. Here, "substantially the same size" means that the size of one of the first metal layer M1 and the second metal layer M2 is greater than or equal to ¾ of the size of the other of the first metal layer M1 and the second metal layer M2. The anode electrode pad AP and the cathode electrode pad KP each have an area large enough to enable plural bonding wires to be connected thereto and a width substantially equal to the width of the substrate 12. Here, "width substantially equal to the width of the substrate 12" means that the width of the electrode pads is greater than or equal to ¾ of the width of the substrate 12.

The emission protection films 38 are protecting films that protect light emission surfaces provided on the p-type contact layers (not shown) on the upper DBRs 26.

As is clear from the above, the light emitting portions formed in units of posts P in the VCSEL array 10 according to the first exemplary embodiment are connected in parallel.

The above-described VCSEL array is capable of emitting a laser output in a direction perpendicular to the substrate, and may be easily formed in the array structure through two-dimensional integration. Therefore, the VCSEL array is used in, for example, a light source for optical communication or a light source of an electronic device, such as a writing light source of an electrophotographic system. The VCSEL array is also used for toner image fixing and ink drying, which require a large amount of light, and in the field of laser processing and illumination.

In a VCSEL array required to emit a large amount of light, the anode and cathode may be required to be arranged on the same side of the substrate (front side of the VCSEL array). The reason for such a requirement is to enable easy connection (serial, parallel, or serial parallel) of the VCSEL array with another VCSEL array and to meet the need to place a radiator on the back side of the VCSEL array. In this field, the VCSEL array may also be required to operate at a low driving voltage. To reduce the driving voltage, the light emitting portions of the VCSEL array may be connected in parallel, and be driven at a driving voltage corresponding to that for driving a single diode. This will be described in more detail with reference to the comparative examples illustrated in FIGS. 8A to 8C.

Figure 8A:
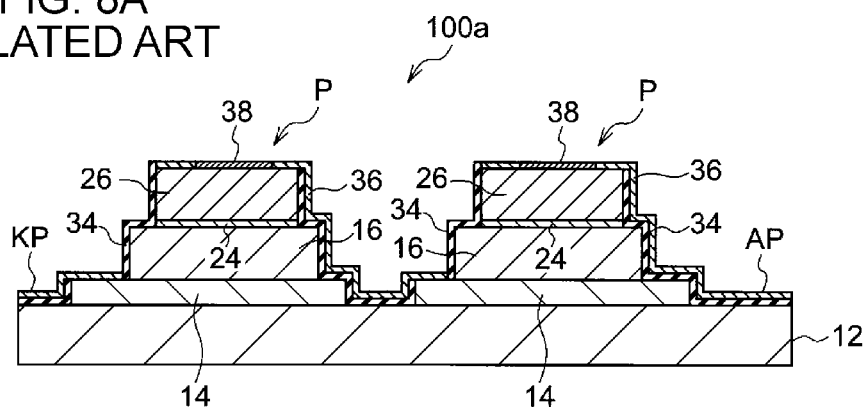
FIGS. 8A to 8C are vertical sectional views illustrating vertical cavity surface emitting laser arrays according to comparative examples.

FIG. 8A illustrates a VCSEL array 100a according to a first comparative example. The VCSEL array 100a is obtained by successively forming n-type buffer layers 14, n-type lower DBRs 16, resonators 24, p-type upper DBRs 26, and emission protection films 38 on a semi-insulating substrate 12 so as to form posts P. An interlayer insulating film 34 is formed on portions of a front surface of the substrate 12 and side surfaces of the posts P, and a single electrode wiring layer 36 is formed on the interlayer insulating film 34. A cathode electrode pad KP and an anode electrode pad AP are provided at one and the other ends of the electrode wiring layer 36.

In the VCSEL array 100a having the above-described structure, although the cathode electrode pad KP and the anode electrode pad AP are formed on the same surface of the substrate, the light emitting portions formed in units of posts P are connected in series. Therefore, a voltage that is greater than or equal to a forward voltage corresponding to the number of light emitting portions connected in series needs to be applied between the cathode electrode pad KP and the anode electrode pad AP, and the driving voltage is increased accordingly.

Figure 8B:
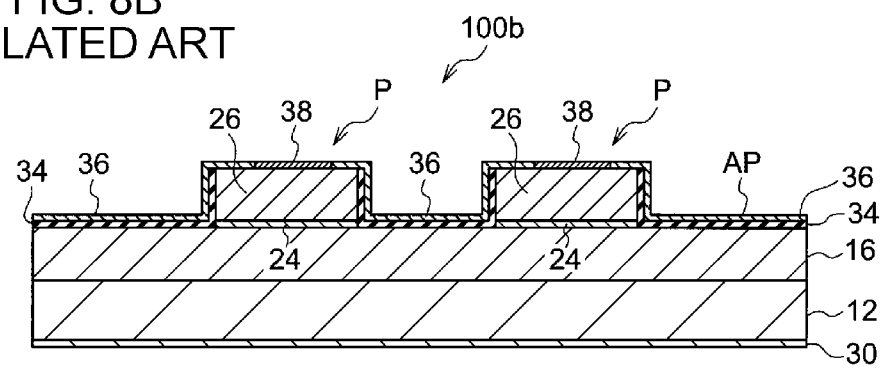

FIG. 8B illustrates a VCSEL array 100b according to a second comparative example. The VCSEL array 100b is obtained by successively forming an n-type lower DBR 16, resonators 24, p-type upper DBRs 26, and emission protection films 38 on an n-type substrate 12 so as to form posts P. An interlayer insulating film 34 is formed on portions of a front surface of the substrate 12 and side surfaces of the posts P, and a single electrode wiring layer 36 is formed on the interlayer insulating film 34. An anode electrode pad AP is provided at one end of the electrode wiring layer 36, and a cathode electrode 30 is provided on the back surface of the substrate 12.

In the VCSEL array 100b having the above-described structure, although the driving voltage is low because the light emitting portions formed in units of posts P are connected in parallel, the cathode electrode pad KP and the anode electrode pad AP are provided on different surfaces of the substrate 12 and the above-described requirement is not met.

Figure 8C:
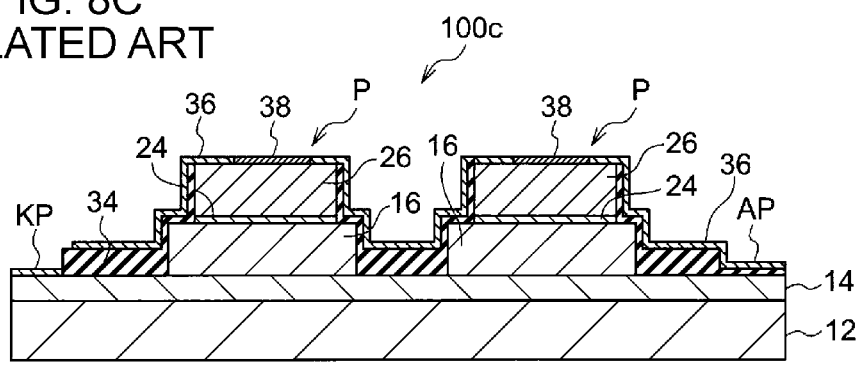

FIG. 8C illustrates a VCSEL array 100c according to a third comparative example. The VCSEL array 100c is obtained by successively forming an n-type buffer layer 14, n-type lower DBRs 16, resonators 24, p-type upper DBRs 26, and emission protection films 38 on a semi-insulating substrate 12 so as to form posts P. An interlayer insulating film 34 is formed on portions of a front surface of the substrate 12 and side surfaces of the posts P, and a single electrode wiring layer 36 is formed on the interlayer insulating film 34. A portion of the electrode wiring layer 36 is connected to the buffer layer 14 so as to form a cathode electrode pad KP. Another portion of the electrode wiring layer 36 is connected to the p-type upper DBRs 26 so as to form an anode electrode pad AP.

In the VCSEL array 100c having the above-described structure, the cathode electrode pad KP and the anode electrode pad AP are provided on the same surface of the substrate. In addition, the light emitting portions formed in units of posts P are connected in parallel, and therefore the driving voltage is low. However, in the VCSEL array 100c, since the electric power is supplied to the light emitting portions through the n-type buffer layer 14, a voltage drop occurs due to the resistance of the buffer layer 14. Therefore, the driving voltage applied to each light emitting portion differs depending on the distance between the light emitting portion and the cathode electrode pad KP, and the uniformity of the emitted light may be reduced.

Accordingly, in the first exemplary embodiment, an n-type buffer layer (contact layer) is provided on the substrate, and the buffer layer applies a negative potential to each of the light emitting portions so that the cathode electrode pad may be disposed on the front surface of the substrate. In addition, the anode-side power supply system and the cathode-side power supply system are separately connected by using the wiring layer having the metal film-insulating film-metal film structure. Thus, the power supply systems may be independently connected. In addition, in the first exemplary embodiment, each of the anode-side power supply wiring and the cathode-side power supply wiring is formed as a continuous surface having an area including all of the posts P of the vertical cavity surface emitting laser array. Furthermore, each of the anode-side power supply wiring and the cathode-side power supply wiring is formed so as to cover the bottom surfaces of the posts P (front surface of the buffer layer 14) and the side surfaces of the posts P. Therefore, the wiring resistance is low and the voltage drop is small even when a large amount of current flows.

The heat dissipating structure of the VCSEL array 10 according to the first exemplary embodiment will be described with reference to FIGS. 3A and 3B. When a large output is required, a large number of VCSEL arrays are used and efficient dissipation of the heat generated by the VCSEL arrays is needed. Accordingly, the VCSEL array 10 has a double mesa structure.

Figure 3A:
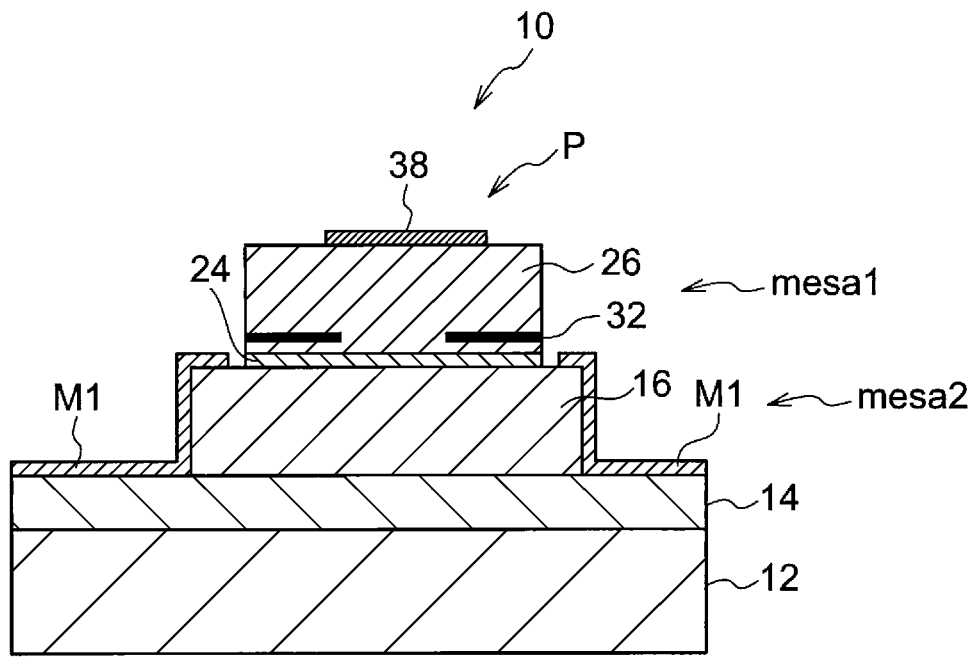
FIG. 3A illustrates a heat dissipating structure of the vertical cavity surface emitting laser array according to the first exemplary embodiment.
Figure 3B:
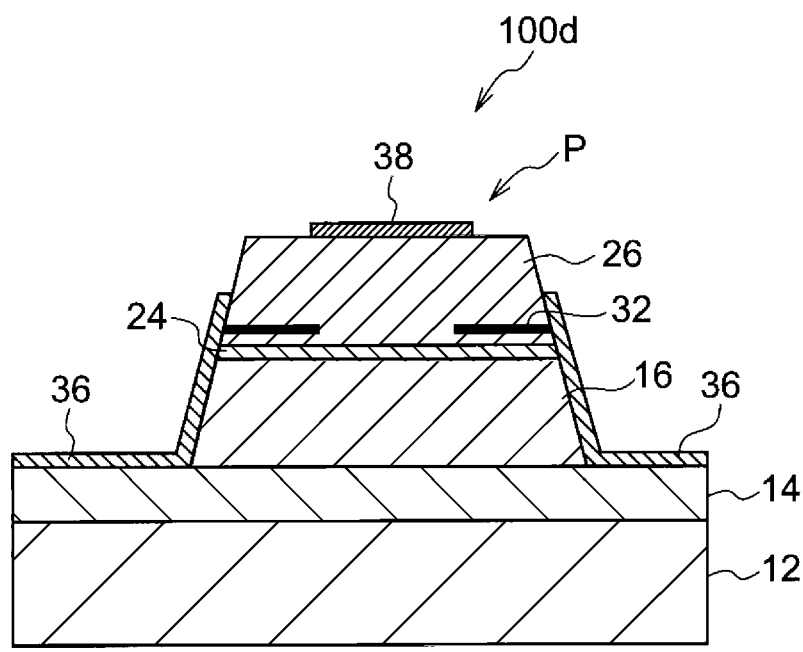
FIG. 3B illustrates a heat dissipating structure of a vertical cavity surface emitting laser array according to the related art.

FIG. 3A illustrates a single post P included in the VCSEL array 10 according to the first exemplary embodiment. FIG. 3B illustrates a single post P included in a VCSEL array 100d according to the related art. In each post P, the substrate 12 is a semi-insulating substrate. Components that are the same as those in the above-described structure are denoted by the same reference numerals, and detailed description thereof is thus omitted.

As illustrated in FIG. 3A, the post P of the VCSEL array 10 according to the first exemplary embodiment has a double mesa structure including a mesa 1 and a mesa 2. Since the post P of the VCSEL array 10 has the double mesa structure, the first metal layer M1, which is a wiring layer for the cathode, is formed so as to cover not only the front surface of the buffer layer 14 but also the side surface and a portion of the front surface of the n-type lower DBR 16. Therefore, the contact area between the first metal layer M1 and the post P (light emitting portion) is increased. As a result, the heat generated by the post P is efficiently collected and the collected heat is efficiently dissipated through, for example, the substrate 12 or the cathode electrode pad KP. Furthermore, the surface area of the first metal layer M1 is increased, and therefore the voltage drop is suppressed.

In contrast, in the VCSEL array 100d, which does not have a step, when the electrode wiring layer 36 is applied to the lower DBR 16 of the post P by vapor deposition, there is a higher risk that the electrode wiring layer 36 will also be applied to the resonator 24 and the upper DBR 26. Therefore, a defect such as short circuiting easily occurs. Whether such a defect will occur depends on the conditions under which the manufacturing steps are performed. Therefore, in the case where the above-described defect is likely to occur, the double mesa structure may be employed.

Although the posts P according to the first exemplary embodiment have a double mesa structure, the posts P are not limited to this. The posts P may instead have a single mesa structure (including only the mesa 1) when the first metal layer M1, which is a wiring layer for the cathode, is formed only on the front surface of the buffer layer 14 and is not formed along the lower DBRs 16.

An example of a method for manufacturing the VCSEL array 10 according to the first exemplary embodiment will now be described with reference to FIGS. 4A to 5D.

Figure 4A:
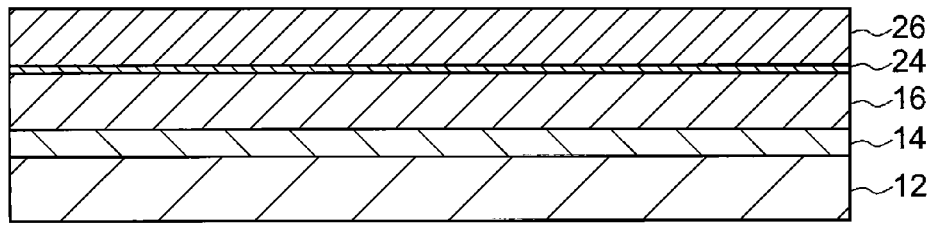
FIGS. 4A to 4D are vertical sectional views illustrating an example of a method for manufacturing the vertical cavity surface emitting laser array according to the first exemplary embodiment.

First, as illustrated in FIG. 4A, an epitaxial wafer in which the buffer layer 14 and layers for forming the lower DBRs 16, the resonators 24, and the upper DBRs 26 are successively formed on the substrate 12 by crystal growth (epitaxial growth) is prepared. The layer for the upper DBRs 26 includes an AlAs layer (not shown) for forming the current constriction layers 32, which will be described below, and a p-type contact layer (not shown) for providing an ohmic connection with a p-side electrode wiring is formed on the layer for the upper DBRs 26. A method for forming the epitaxial wafer will now be described.

As illustrated in FIG. 4A, first, the buffer layer 14, which is made of n-type GaAs and has a carrier density of about $2\times10^{18}$ cm$^{-3}$ and a film thickness of about 500 nm, for example, is formed on the semi-insulating GaAs substrate 12 by metal organic chemical vapor deposition (MOCVD).

Next, the layer for the n-type lower DBRs 16 is formed by alternately stacking $Al_{0.3}Ga_{0.7}As$ and $Al_{0.9}Ga_{0.1}As$ layers, both having a film thickness of 0.25λ, on the buffer layer 14 for 47.5 cycles. The $Al_{0.3}Ga_{0.7}As$ and $Al_{0.9}Ga_{0.1}As$ layers both have a carrier density of about $2\times10^{18}$ cm$^{-3}$, and the total thickness of the layer for the lower DBRs 16 is about 4 μm. The n-type carriers are, for example, Si.

Next, the layer for the resonators 24 including a lower spacer layer composed of a non-doped $Al_{0.6}Ga_{0.4}As$ layer, a non-doped quantum well active layer, and an upper spacer layer composed of a non-doped $Al_{0.6}Ga_{0.4}As$ layer are formed on the layer for the lower DBRs 16. The quantum well active layer includes, for example, four barrier layers composed of $Al_{0.3}Ga_{0.7}As$ layers, and three quantum well layers composed of $Al_{0.11}Ga_{0.89}As$ layers and disposed between the barrier layers. Here, the film thickness of the barrier layers composed of $Al_{0.3}Ga_{0.7}As$ layers is about 5 nm, and the film thickness of the quantum well layers composed of $Al_{0.11}Ga_{0.89}As$ layers is about 9 nm. The total film thickness of the layer for the resonators 24 is equal to the wavelength λ in the medium.

Next, the layer for the p-type upper DBRs 26 is formed by forming a p-type AlAs layer (not shown) on the upper spacer layer and alternately stacking $Al_{0.3}Ga_{0.7}As$ and $Al_{0.9}Ga_{0.1}As$ layers, both having a film thickness of 0.25λ, on the AlAs layer for 25 cycles. The $Al_{0.3}Ga_{0.7}As$ and $Al_{0.9}Ga_{0.1}As$ layers have a carrier density of about $2\times10^{18}$ cm$^{-3}$, and the total thickness of the layer for the upper DBRs 26 is about 3 μm. The p-type carriers are, for example, carbon (C). A p-type contact layer (not shown) made of p-type GaAs having a carrier density of about $1\times10^{19}$ cm$^{-3}$ and a film thickness of about 10 nm is formed on the layer for the upper DBRs 26.

Next, steps of the method for manufacturing the VCSEL array 10 according to the first exemplary embodiment after the epitaxial growth will be described.

Figure 4B:
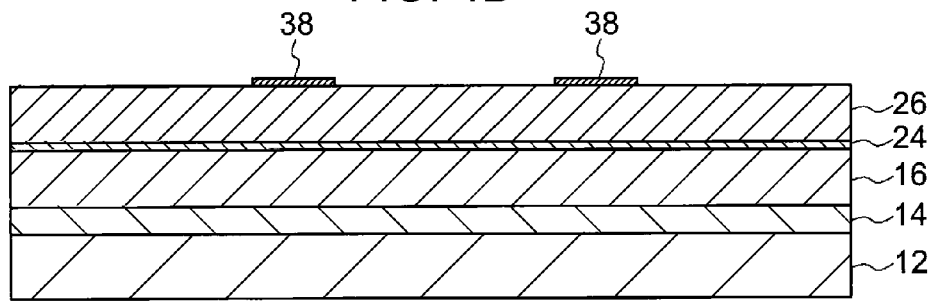

First, as illustrated in FIG. 4B, the emission protection films 38 are formed by forming a film of the material of the emission protection films 38 on the wafer surface and etching the material by photolithography by using a mask. The material of the emission protection films 38 may be, for example, SiN.

Figure 4C:
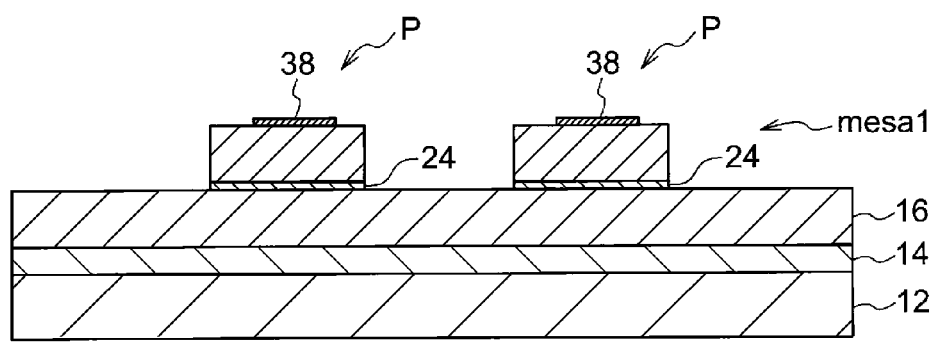

Next, as illustrated in FIG. 4C, the mesas 1 of the posts P are formed by applying a mask material to the wafer surface, forming a mask by processing the mask material by, for example, photolithography, and etching the wafer by using the mask.

Figure 4D:
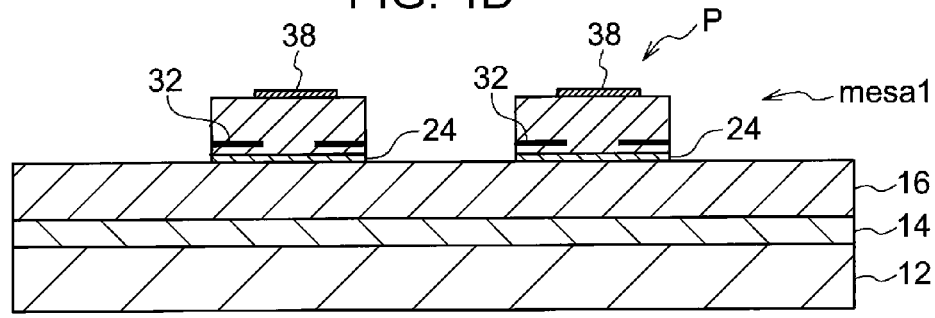

Next, as illustrated in FIG. 4D, the current constriction layers 32 are formed in the posts P by subjecting the wafer to an oxidation treatment for oxidizing the AlAs layers (not shown) in the upper DBRs 26 from the sides thereof. The current constriction layers 32 include the current injection regions and the selective oxidation regions. The selective oxidation regions are regions at the peripheries of the posts P that have been oxidized in the oxidation treatment, and the current injection regions are regions that have not been oxidized.

Figure 5A:
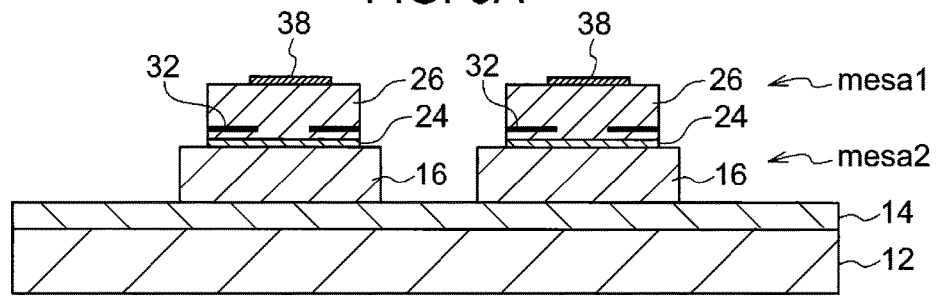
FIGS. 5A to 5D are vertical sectional views illustrating the example of the method for manufacturing the vertical cavity surface emitting laser array according to the first exemplary embodiment.

Next, as illustrated in FIG. 5A, the mesas 2 are formed below the mesas 1 by applying a mask material to the wafer surface, forming a mask by processing the mask material by, for example, photolithography, and etching the wafer by using the mask.

Figure 5B:
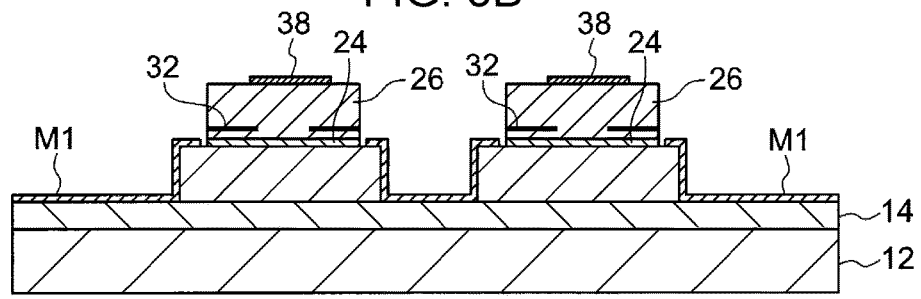

Next, as illustrated in FIG. 5B, the first metal layer M1 is formed by forming a film of an electrode material on the wafer surface and etching the electrode material by using a mask formed by, for example, photolithography. In the first exemplary embodiment, the first metal layer M1 is formed on the exposed portions of the front surface of the buffer layer 14, the side surfaces of the lower DBRs 16, and portions of the top surfaces of the lower DBRs 16. A portion of the first metal layer M1 serves as the cathode electrode pad KP (see FIG. 2A). The first metal layer M1 is composed of, for example, an Au film.

Figure 5C:
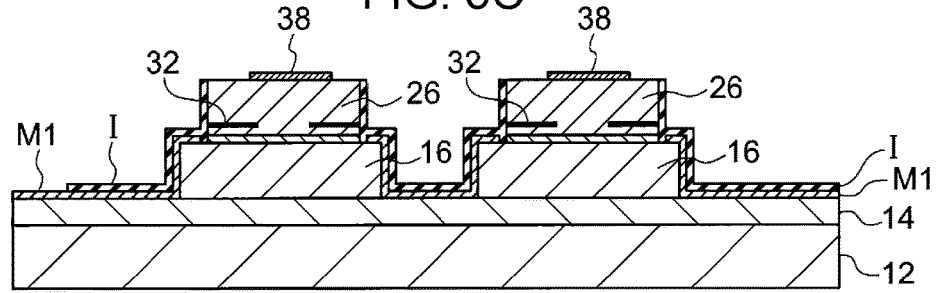

Next, as illustrated in FIG. 5C, the interlayer insulating film I is formed on the wafer surface over the entire region thereof excluding the top surfaces of the upper DBRs 26. The interlayer insulating film I is composed of, for example, a SiN film.

Figure 5D:
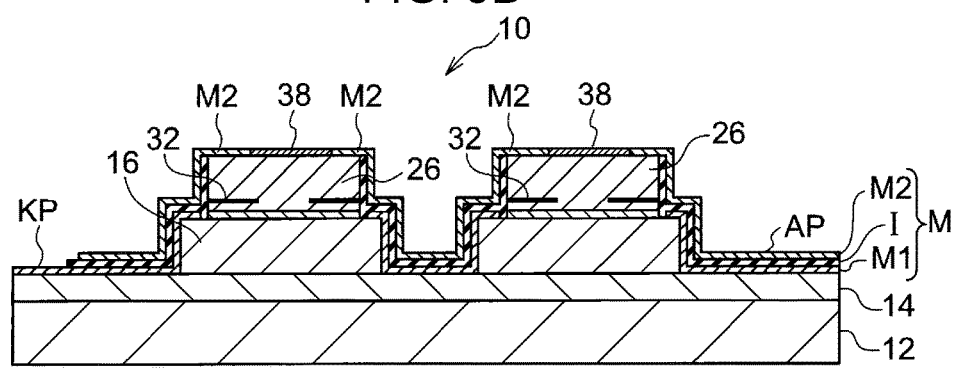

Next, as illustrated in FIG. 5D, the second metal layer M2 is formed by forming a film of an electrode material on the wafer surface and etching the electrode material by using a mask formed by, for example, photolithography. In the first exemplary embodiment, the second metal layer M2 is formed on the interlayer insulating film I and portions of the top surfaces of the upper DBRs 26. A portion of the second metal layer M2 serves as the anode electrode pad AP (see FIG. 2B). The second metal layer M2 is composed of, for example, an Au film.

Next, dicing is performed in dicing regions (not shown) to separate individual VCSEL arrays 10 from each other. The VCSEL array 10 is manufactured by the above-described steps.

Second Exemplary Embodiment

Figure 6:
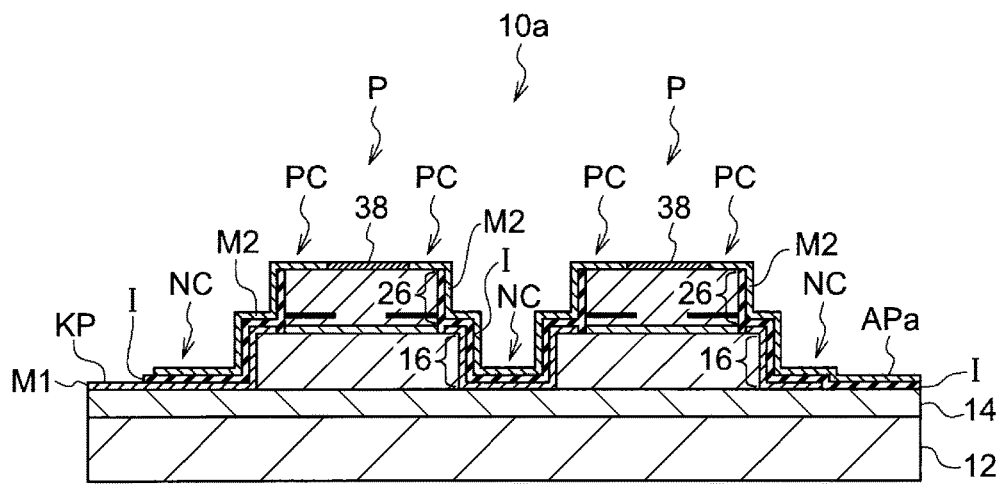
FIG. 6 is a vertical sectional view illustrating an example of the structure of a vertical cavity surface emitting laser array according to a second exemplary embodiment.

A VCSEL array 10a according to a second exemplary embodiment will be described with reference to FIG. 6. The VCSEL array 10a includes an anode electrode pad AP having a structure different from that in the VCSEL array 10. Components that are the same as those of the VCSEL array 10 are denoted by the same reference numerals, and detailed description thereof is thus omitted.

As illustrated in FIG. 1, the anode electrode pad AP of the VCSEL array 10 has the M1-I-M2 structure. In contrast, as illustrated in FIG. 6, an anode electrode pad APa of the VCSEL array 10a is constituted by the interlayer insulating film I and the second metal layer M2 formed on the buffer layer 14 (I-M2 structure). The interlayer insulating film I is formed directly on the buffer layer 14. In the VCSEL array 10a, since the I-M2 structure is employed, the resistance to impact during mounting using, for example, bonding wires is increased.

When the VCSEL array 10 is connected to another VCSEL array or mounted on a package by using bonding wires, there is a possibility that the yield will be reduced due to a leak current generated at the anode electrode pad AP. This is probably because when the anode electrode pad AP receives a strong impact from a wedge or the like during wire bonding, the first metal layer M1 at the lower side may be deformed, and the interlayer insulating film I may crack as a result. Accordingly, the second metal layer M2 and the first metal layer M1 may come into contact with each other or come close enough to cause a leakage, thereby generating a leak current.

Accordingly, in the VCSEL array 10a of the second exemplary embodiment, the first metal layer M1 at the lower side, which may be bent, is removed from the region of the anode electrode pad AP, and the above-described I-M2 structure is employed. It has been confirmed that the leakage failure during mounting using bonding wires is suppressed when the I-M2 structure is employed. The I-M2 structure of the VCSEL array 10a is employed when there is a risk that the anode electrode pad AP will receive a strong impact during bonding. When the bonding method is such that it is not necessary to consider the impact during bonding of the anode electrode pad AP, for example, when face-down bonding using solder balls is performed, the M1-I-M2 structure of the VCSEL array 10 may be employed.

Third Exemplary Embodiment

A VCSEL array 10b according to a third exemplary embodiment will be described with reference to FIG. 7. In the VCSEL array 10b, the region in which the first metal layer M1 is formed differs from that in the VCSEL array 10a. Components that are the same as those in the VCSEL array 10a are denoted by the same reference numerals, and detailed description thereof is thus omitted.

Figure 7:
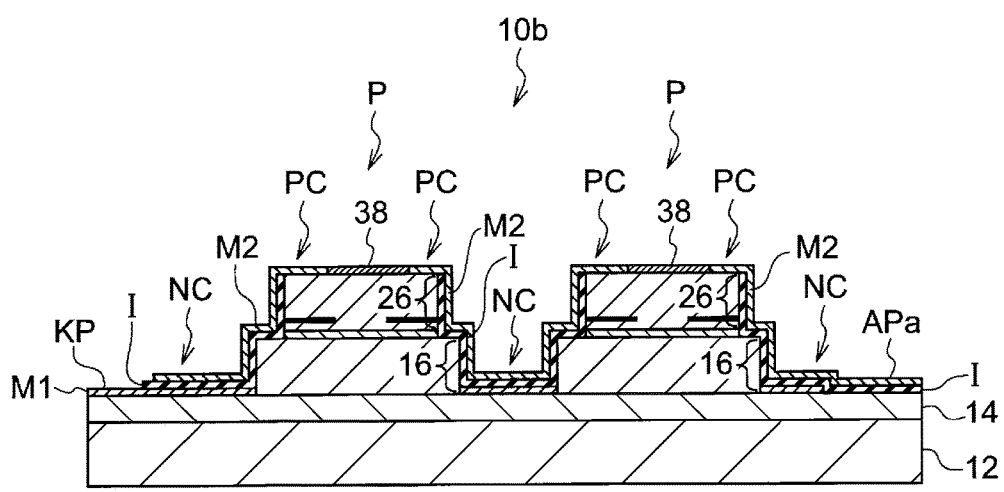
FIG. 7 is a vertical sectional view illustrating an example of the structure of a vertical cavity surface emitting laser array according to a third exemplary embodiment.

As illustrated in FIG. 7, in the VCSEL array 10b, the first metal layer M1 is formed only on the buffer layer 14, and does not extend along the lower DBRs 16. When the requirements regarding heat dissipation are not severe, for example, when the number of VCSEL arrays 10b to be connected is small, the first metal layer M1 may be formed in this way. When the first metal layer M1 is formed in this way, the amount of wiring material, such as gold, may be reduced and the cost may be reduced accordingly.

Other Exemplary Embodiments

It is not necessary that the first metal layer M1 and the second metal layer M2 have an area including all of the posts P on the semiconductor chip as long as the area thereof includes at least some of the posts P. For example, a single semiconductor chip may be divided into plural regions, each including plural posts P, and the anode electrode pad AP and the cathode electrode pad KP may be provided for each region. The regions may be connected in parallel or in series.

It is not necessary that the first metal layer M1 cover portions of the side surfaces of the posts P (lower DBRs) as long as the first metal layer M1 substantially covers the bottom surface (front surface of the buffer layer 14) around the posts P in the region where the posts P are formed. In other words, the first metal layer M1 may cover only the bottom surface around the posts P or both the bottom surface around the posts P and at least portions of the side surfaces of the posts P. In the double mesa structure, the first metal layer M1 may cover the bottom surface around the posts P, the side surfaces of the posts P, and at least portions of the top surfaces of the mesas 2.

In the above-described exemplary embodiments, the vertical positional relationship between the anode and cathode may be inverted.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A vertical cavity surface emitting laser array comprising:
   a contact layer formed on a substrate;
   a plurality of mesa structures formed on the contact layer, each mesa structure including
      a first semiconductor multilayer reflector of a first conductivity type,
      an active region on the first semiconductor multilayer reflector, and
      a second semiconductor multilayer reflector of a second conductivity type on the active region,
   a first metal layer formed on the contact layer around the mesa structures, a portion of the first metal layer serving as an electrode pad of the first conductivity type;
   an insulating film formed on the first metal layer; and
   a second metal layer formed on the insulating film, a portion of the second metal layer serving as an electrode pad of the second conductivity type,
   wherein the mesa structures are electrically connected in parallel.

2. The vertical cavity surface emitting laser array according to claim 1, wherein the electrode pad of the second conductivity type is formed on a multilayer body including the first metal layer formed on the contact layer and the insulating film formed on the first metal layer.

3. The vertical cavity surface emitting laser array according to claim 1, wherein the electrode pad of the second conductivity type is formed on the insulating film formed directly on the contact layer.

4. The vertical cavity surface emitting laser array according to claim 1, wherein the first metal layer and the second metal layer are each formed of a single continuous metal layer.

5. The vertical cavity surface emitting laser array according to claim 1, wherein the electrode pad of the first conductivity type and the electrode pad of the second conductivity type each have an area large enough to enable a plurality of bonding wires to be connected thereto.

6. The vertical cavity surface emitting laser array according to claim 1, wherein the electrode pad of the first conductivity type and the electrode pad of the second conductivity type each have a width that is substantially equal to a width of the substrate.

7. The vertical cavity surface emitting laser array according to claim 1, wherein a size of the first metal layer and a size of the second metal layer are substantially equal in a region in which the mesa structures are formed.

8. The vertical cavity surface emitting laser array according to claim 1, wherein the first metal layer covers at least portions of side surfaces of the first semiconductor multilayer reflectors.

9. The vertical cavity surface emitting laser array according to claim 1, wherein the second metal layer covers entireties of side surfaces of the mesa structures with the insulating film interposed therebetween.

10. The vertical cavity surface emitting laser array according to claim 1, wherein each mesa structure includes a first mesa including the second semiconductor multilayer reflector and the active region, and a second mesa including the first semiconductor multilayer reflector and having an external shape larger than an external shape of the first mesa.

11. The vertical cavity surface emitting laser array according to claim 10, wherein the first metal layer covers side surfaces of the first semiconductor multilayer reflectors and portions of top surfaces of the first semiconductor multilayer reflectors.

12. A vertical cavity surface emitting laser array comprising:

a plurality of light emitting portions having mesa structures;
a first metal layer formed on a bottom surface around the mesa structures, a portion of the first metal layer serving as an electrode pad of a first conductivity type;
an insulating film formed on the first metal layer; and
a second metal layer formed on the insulating film, a portion of the second metal layer serving as an electrode pad of a second conductivity type,
wherein the mesa structures are electrically connected in parallel.

13. A method for manufacturing a vertical cavity surface emitting laser array comprising:

etching semiconductor layers so that a contact layer is exposed to form mesa structures of the semiconductor layers, the semiconductor layers being formed on a substrate and including the contact layer, first semiconductor multilayer reflectors of a first conductivity type, active regions, and second semiconductor multilayer reflectors of a second conductivity type;
forming a first metal layer that covers a region including the contact layer around the mesa structures, a portion of the first metal layer serving as an electrode pad of the first conductivity type;
forming an insulating film on the first metal layer in a region excluding top surfaces of the mesa structures; and
forming a second metal layer on the insulating film in a region including portions of the top surfaces of the mesa structures, a portion of the second metal layer serving as an electrode pad of the second conductivity type.

* * * * *